United States Patent [19]

Flesner

[11] Patent Number: 4,912,330
[45] Date of Patent: Mar. 27, 1990

[54] APPARATUS FOR X-RAY TESTING LONG WAVE INFRARED RADIATION DETECTORS

[75] Inventor: Larry D. Flesner, San Diego, Calif.

[73] Assignee: United States of America as represented by the Secretary of the Navy, Washington, D.C.

[21] Appl. No.: 295,084

[22] Filed: Dec. 27, 1988

[51] Int. Cl.$^4$ ............................................. G01N 23/00
[52] U.S. Cl. .................................... 250/352; 378/207
[58] Field of Search ........................... 250/352, 338.1; 378/207

[56] References Cited

PUBLICATIONS

Flesner et al., "Electron—Beam Apparatus for Testing LWIR Detectors . . . ", IEEE Nucl. Science, vol. NS—23, #6, (Dec. 87), p. 1602.
Cohen et al., "SEM Irradiation for Hardness Assurance . . . ", IEEE Nucl. Science, vol. NS—2, (Dec. 74), p. 387.

Primary Examiner—Janice A. Howell
Assistant Examiner—Richard Hanig
Attorney, Agent, or Firm—Harvey Fendelman; Thomas Glenn Keough; Michael A. Kagan

[57] ABSTRACT

An apparatus for testing infrared detector response to ionizing radiation within an infrared shielded environment includes a cryostat having an aperture which is positioned adjacent to a scanning electron microscope (SEM). The SEM generates an electron beam which propagates through the aperture and is absorbed by a foil positioned adjacent the detector. The interaction of the electron beam with the foil produces X-rays which irradiate the detector. Instruments electrically coupled to the detector record and display the detector response.

19 Claims, 4 Drawing Sheets

APPARATUS FOR X-RAY TESTING LONG WAVE INFRARED RADIATION DETECTORS

The invention described herein may be manufactured and used by or for the Government of the United States of America for governmental purposes without the payment of any royalties thereon or therefore.

BACKGROUND OF THE INVENTION

A need exists for long wave infrared radiation (LWIR) detectors capable of performing when exposed to ionizing radiation. Such applications are found in space borne surveillance systems. Development of such detectors requires application of testing methods to evaluate detector performance in an ionizing radiation environment. This type of detector must be performance tested with an apparatus capable of shielding the detector from room temperature infrared radiation which would overwhelm the detector.

Presently, testing LWIR detector response to ionizing radiation within a low background infrared radiation environment is generally done by exposing detectors housed in cryogenic chambers to cobalt-60 gamma radiation. The gamma rays produce high-energy Compton electrons which penetrate the test sample and produce ionizing effects. The difficulty with this approach is that Compton electrons penetrate the test chamber with highly variable energies and trajectories due to random origin and scattering in the chamber. This causes considerable uncertainty in the interpretation of experimental results.

The detectors can also be tested by exposing them to energetic electrons from electron beam sources such as a linear accelerator or a scanning electron microscope as described by Flesner, L. D., et al., in "Electron-Beam Apparatus For Testing LWIR Detectors In A Cryogenically Shielded Environment", *IEEE Transactions On Nuclear Science*, Vol. NS-34, No. 6, December 1987. However, electron beams do not completely simulate the environment in which these detectors are to operate and have inherent limitations discussed below.

Other testing methods utilize X-rays. Ionizing radiation response testing using an X-ray source has the advantage over Co-60 radiation in that the X-ray can be selectively energized. An advantage of X-rays over energetic electrons is that the X-rays provide greater sample penetration for a given energy level. For example, 20 keV X-rays will penetrate with little attenuation through a 250 micrometer thick silicon wafer while electrons require an energy level greater than 200 keV to attain comparable penetration.

Conventional methods for X-ray testing involve propagating X-rays from a source which is external to the cryogenic test chamber through a window into the chamber. Since the X-ray source location is at a significant distance from the detector, this method requires X-rays of high intensity to compensate for divergence as they propagate from their source to the LWIR detector. There are numerous disadvantages to using high-intensity X-ray sources for this type of testing which include: expense, difficulty of modulation, and hazardous operation.

Therefore, a need exists for an apparatus which can test LWIR detector response to X-ray exposure with low intensity X-ray radiation within a low infrared radiation environment.

OBJECTS OF THE PRESENT INVENTION

An object of the present invention is to provide an apparatus which enables infrared detectors to be tested for response to X-ray exposure within a low background infrared radiation environment.

Another object of the present invention is to provide an apparatus for testing an infrared detector to X-ray exposure within an environment of approximately 5 to 70 degrees Kelvin.

DESCRIPTION OF THE PREFERRED EMBODIMENT

Figure 1:
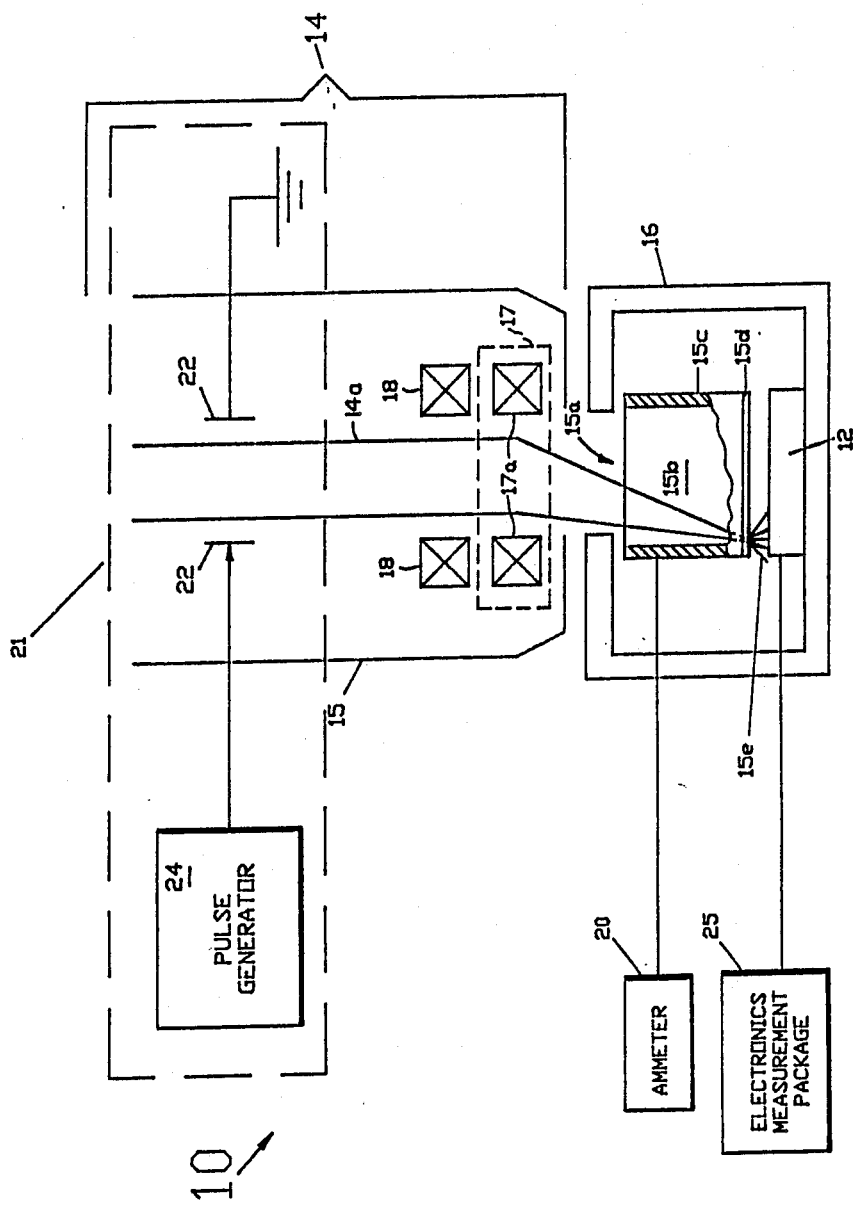
FIG. 1 is a schematic representation of the present invention.

Referring now to the drawings wherein like reference numerals designate like or similar parts throughout the several views, there is illustrated in FIG. 1 a schematic diagram of apparatus 10 for testing the response of infrared detector 12 to ionizing radiation exposure within an infrared shielded environment. Apparatus 10 includes scanning electron microscope (SEM) 14 for generating electron beam 14a. However, the scope of the invention comprehends use of other types of electron beam sources such as a cathode ray tube electron beam gun in place of an SEM. The beam propagates through SEM column 15, passes through aperture 15a of cryostat 16, enters interior 15b of target tube 15c, and then irradiates an X-ray generating target such as target foil 15d. Target tube 15c is positioned within the interior of cryostat 16 to intercept and absorb electron beam 14a, as well as infrared radiation which enters cryostat 16 through aperture 15a. The interaction of electron beam 14a with target foil 15d produces X-rays 15e by physical processes such as bremsstrahlung. X-rays 15e then irradiate detector 12.

SEM 14 includes objective focusing lens 17 comprising focusing coils 17a, and deflection coils 18 for directing electron beam 14a. Coils 17a and 18 are manually controlled to direct electron beam 14a to specific regions of target foil 15d. Directing an electron beam generated by an SEM with focusing and directing coils is accomplished by techniques well known to those skilled in this art. SEM 14 also includes beam blanker system 21 comprised of charge plates 22 and pulse generator 24. Pulse generator 24 activates charge plates 22 with a suitable pulse pattern by well known techniques known to those skilled in this art.

Ammeter 20 is operably coupled to target tube 15c to monitor the intensity of electron beam 14a. Monitoring the intensity of an electron beam with an ammeter is well known to those skilled in this art. A suitable ammeter is Keithley Model 480 Pico Ammeter, although the scope of the invention includes utilization of other suitable ammeters. Measurement circuit 25 is operably coupled to infrared detector 12 and detects various selected properties of infrared detector 12 measured in response to irradiation by X-rays 15e. The construction and coupling of measurement circuit 25 to detector 12 are effectuated in accordance with techniques well known by those skilled in this art.

One type of suitable scanning electron microscope 14 is JEOL (Japan Electronics Optics Laboratory) Model JSM-35, identified for purposes of illustration only. It is to be understood that the scope of the invention includes models of SEM's other than the one identified herein.

Figure 2:
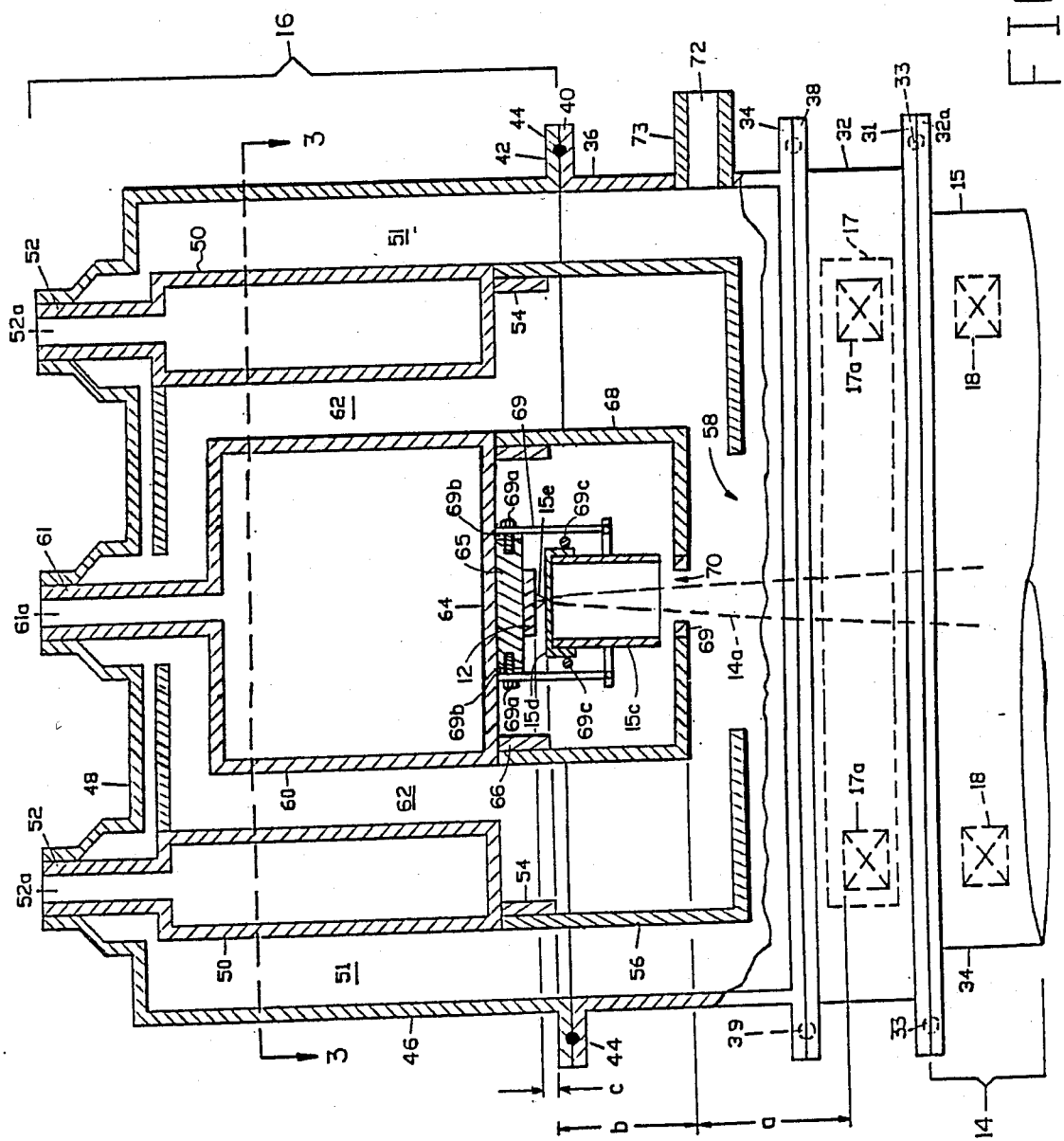
FIG. 2 is a partial cut-away view of the present invention.
Figure 3:
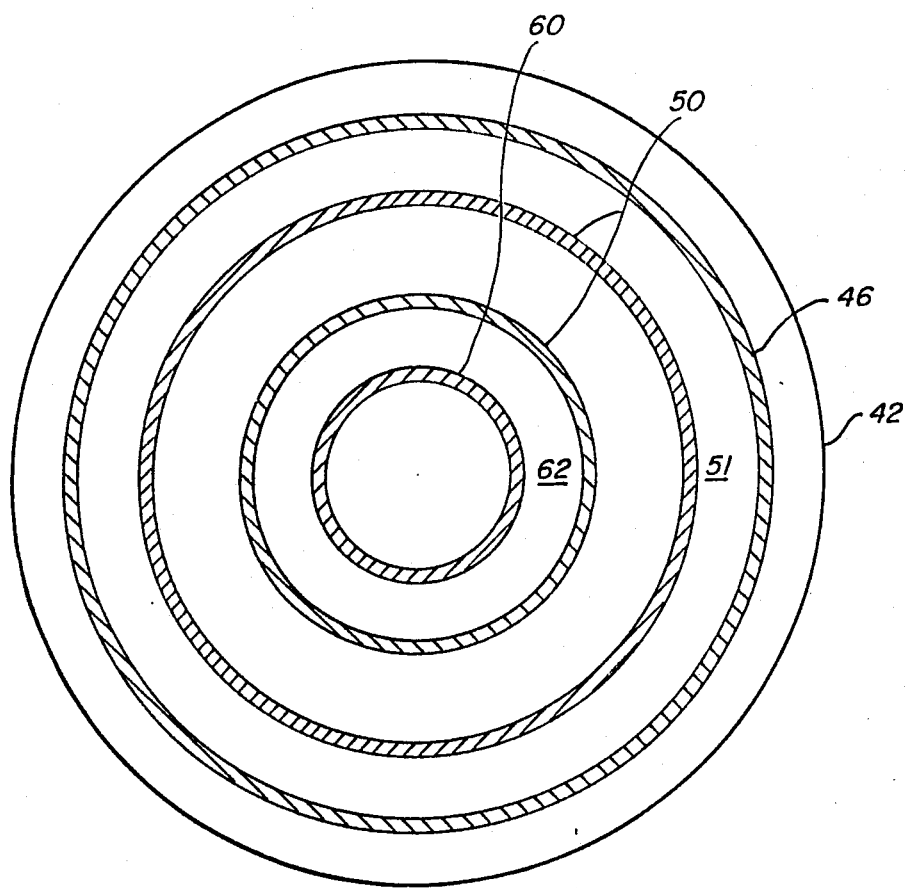
FIG. 3 is a cross-sectional view of the cryostat taken along line 3—3 of FIG. 2.
Figure 4:
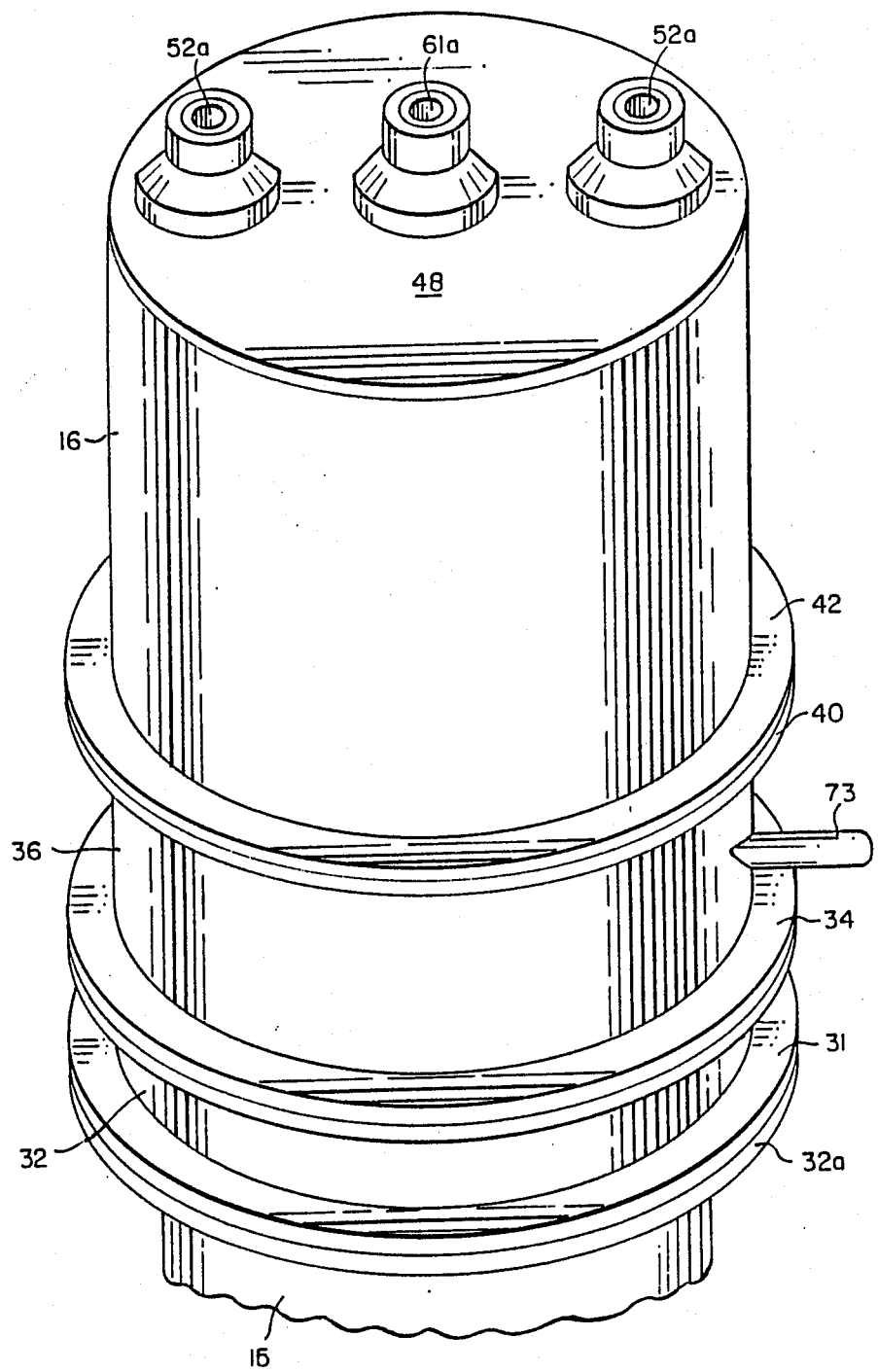
FIG. 4 is three-fourths perspective view of the cryostat.

Referring to FIGS. 2, 3, and 4 collectively, in which specific features of the construction of the invention are illustrated, SEM 14 was modified by repositioning the standard JEOL model JSM-35 SEM column 15 by 180 degrees so that electron beam 14a is emitted vertically upward. Annular flange 31 of hollow cylindrical coupler 32 is mounted to annular flange 32a of focusing end 34 of SEM column 15 by techniques well known by those skilled in this technology, as for example by bolting, not shown. "O"-ring 33, interposed between flanges 31 and 32a, provides a vacuum tight seal therebetween. Annular flange 34 of hollow cylindrical spacer 36 is bolted (not shown) to annular flange 38 of coupler 32. "O"-ring 39 is interposed between flanges 34 and 38 to provide a vacuum tight seal therebetween. Annular flange 40 of spacer 36 is bolted (not shown) to annular flange 42 of cryostat 16. "O"-ring 44 is interposed between flanges 40 and 42 to provide a vacuum tight seal therebetween.

Cryostat 16 has a cylindrical outer shell 46 and a top surface plate 48. Inlets 52a provide fluid communication between the exterior of cryostat 16 and the interior of vessel 50. Ring shaped vessel 50 is suspended within cryostat 16 by tubes 52 having inlets 52a which extend through plate 48. The outer diameter of vessel 50 is less than the inside diameter of shell 46, thus creating space 51 therebetween. Annular flange 54 extends from the bottom outside periphery of vessel 50 and is externally threaded (not shown) to receive internally threaded (not shown) cup-like vessel 56. Vessel 56 includes aperture 58 through which the electron beam passes.

Cryostat 16 also includes inner tubular shaped vessel 60. Vessel 60 is suspended inside cryostat 16 and within the inside diameter of vessel 50 by tube 61 having inlet 61a, creating space 62 therebetween. Vessel 60 include bottom plate 64 to which sample mounting plate 65 is mounted. Externally threaded (not shown) annular flange 66 is mounted to the bottom surface of plate 64 and receives internally threaded (not shown) cup-like chamber 68. Chamber 68 includes insert 69 having aperture 70 through which electron beam 14a passes. Apertures 58 and 70 are concentric with respect to each other and may be of any suitable size.

Referring to FIG. 2, target tube 15c is supported within chamber 68 by bracket 69 which is mounted to plate 65 by threaded fasteners 69a. Washers 69b are interposed between bracket 69 and plate 65 to electrically isolate and thermally connect target tube 15c with respect to cryostat 16. In the preferred embodiment, washers 69b were made of mica because it is an electrical insulator having relatively good thermal conductance properties, although other materials, such as ceramics, may be used. The techniques described herein for utilizing mica washers for thermally connecting and electrically isolating one structure from another, as was done, for example, with target tube 15c with respect to cryostat 16, was achieved by techniques well known by those skilled in this technology and is described for purposes of illustration only.

Target foil 15d is mounted to target tube 15c by spring clamp 69c, although other suitable methods of may be employed, as for example, by welding foil 15d to target tube 15c. Target tube 15c is mounted within chamber 68 so that target foil 15d is substantially adjacent detector 12. The surface area of target foil 15d and hence the inside diameter of target tube 15c are preferably equivalent to or slightly greater than the area of detector 12 to facilitate irradiation of the entire area of detector 12 with X-rays propagated from foil 15d. Target foil 15d is manufactured of a suitable metal foil having a thickness such that electron beam 14a does not penetrate through foil 15d while X-rays generated when electron beam 14a irradiates foil 15d penetrate therethrough. In an example of the preferred embodiment, target foil 15d was made of aluminum foil having a thickness of approximately 100 nanometers.

Inlet 61a provides fluid communication between the exterior of cryostat 16 and the interior of vessel 60.

Spacer 36 includes port 72 of pump port 73 through which a vacuum may be drawn within microscope 14, spacer 36, and cryostat 16, exclusive of the interiors of vessels 50 and 60.

Still referring to FIG. 2, in the preferred embodiment, the distance, A, between focusing lens 17 and aperture 70 is approximately 15 mm; the distance, b, between aperture 70 and target foil 15d is a value preferably in the range of 20 to 40 cm; and the distance, c, between the surface of target foil 15d and the surface of detector 12 is as close as is reasonably practicable, preferably about 3 mm. Aperture 58 is approximately 1 cm in diameter. Aperture 70 has been successfully used having a diameter of approximately 5 millimeters. It is to be understood that the scope of the invention includes values for the diameters of apertures 58 and 70, as well as for distances A, b, and c, other than those specifically described herein.

OPERATION OF THE INVENTION

Referring to FIGS. 1 and 2, infrared detector 12 is mounted to plate 65. A vacuum is drawn from the interior of cryostat 16, spacer 32, and SEM column 15 through port 72. Liquid helium is poured through inlet 61 so that it then is retained within vessel 60. Liquid nitrogen, poured through either or both of inlets 52a, is retained within vessel 50. Thus, a cold chamber of approximately 5 to 20 degrees Kelvin, substantially free of background infrared radiation, is created within the space defined by the interior of chamber 68 and plate 64.

Pulse generator 24 activates blanking plates 22 of SEM 14 in a suitable pattern to correspondingly modulate electron beam 14a. Electron beam 14a passes through apertures 58 and 70 and then is intercepted by target foil 15d. The region of target foil 15d irradiated with electron beam 14a is controlled by focusing coils 17a and deflection coils 18. Controlling deflection and focusing coils of an SEM, such as coils 17a and 18, is well known by those skilled in this art. The electrical current produced by electron beam 14a is measured by ammeter 20. A suitable energy level for electron beam 14a is 40 keV. X-rays generated through the interaction of electron beam 14a with target foil 15d in turn irradiate detector 12. The response of detector 12 to X-ray irradiation is detected by measurement electronics package 25.

Obviously, many modifications and variations of the present invention are possible in light of the above teachings. It is therefore to be understood that within the scope of the appended claims the invention may be practiced otherwise than as specifically described.

I claim:

1. An apparatus for testing the response of an infrared detector to ionizing radiation exposure, comprising:
   first means for shielding said detector from infrared radiation having a wavelength of at least 1 micrometer;
   second means positioned adjacent to said detector for selectively propagating X-rays upon said detector; and
   third means operably coupled to said detector for detecting a response of said detector to exposure to said X-rays.

2. The apparatus of claim 1 wherein:
   said second means comprises fourth means for selectively generating an electron beam;
   said first means is a cryostat having an aperture and an interior, said cryostat including a mounting surface within said interior for mounting said detector, said aperture having a first area and being positioned so said electron beam may be propagated through said aperture, said first area having a centroid; and
   said apparatus includes an X-ray generating target, said target positioned so as to intercept said electron beam and generate said X-rays, said target positioned so said X-rays irradiate said detector.

3. The apparatus of claim 2 wherein:
   said target is a foil interposed between said electron beam and said detector.

4. The apparatus of claim 3 wherein:
   said cryostat includes a target duct having first and second ends, said first end having a second area being at least equal in size to said first area of said aperture, said target duct further having a longitudinal axis, said target duct being mounted to said cryostat so that said first end faces said aperture and a projection of said longitudinal axis substantially intersects said centroid of said first area and said longitudinal axis is substantially normal to said first area; and
   said foil is mounted over said second end of said target tube.

5. The apparatus of claim 4 wherein:
   said fourth means comprises a scanning electron microscope.

6. The apparatus of claim 5 in which said cryostat includes:
   a cooling shield.

7. The apparatus of claim 6 in which said cooling shield includes:
   liquid helium.

8. The apparatus of claim 7 in which said cooling shield includes:
   liquid nitrogen.

9. A method for testing a response of an infrared detector to ionizing radiation exposure, comprising the steps of:
   shielding said detector from infrared radiation having a wavelength of at least 1 micrometer;
   selectively propagating X-rays upon said detector; and
   detecting a response of said detector to exposure to said X-rays.

10. The method of claim 9 wherein:
    the step of shielding includes placing said infrared detector in a cryostat having an X-ray generating target; and
    the step of propagating includes:
    propagating an electron beam upon said target whereby the interaction of said electron beam with said target generates said X-rays.

11. The method of claim 10 wherein:
    the step of propagating includes placing said target substantially adjacent said detector.

12. The method of claim 11 which further includes the step of:
    shielding said detector with a cooling shield.

13. The method of claim 12 in which the step of shielding includes:
    boiling liquid helium.

14. The method of claim 13 in which the step of shielding includes:
    boiling liquid nitrogen.

15. An apparatus for testing the response of an infrared detector to ionizing radiation exposure, comprising:
    a cryostat having an inner chamber with a first aperture having a diameter and a second aperture in the exterior surface of said cryostat providing fluid communication between said inner chamber and the exterior of said cryostat;
    a mounting surface positioned in said inner chamber for supporting said detector;
    a target tube having an inner diameter greater than said diameter of said first aperture, and first and second open ends, said target tube being mounted within said inner chamber such that said target tube is thermally connected to and electrically isolated from said cryostat, said first end positioned substantially adjacent to said mounting surface, said target tube positioned being positioned within said inner chamber so that said first aperture is within a perpendicular projection of said second open end;
    a target foil having an area with a centroid of said area, mounted over said first end of said target tube;
    means positioned adjacent to said cryostat for generating and propagating an electron beam through said first aperture and into said second open end of said target tube so that said electron beam is propagated substantially onto said centroid of said target foil; and
    means operably coupled to said detector for detecting a response of said detector to exposure to said X-rays.

16. The apparatus of claim 15, wherein:
    said means for generating and propagating said electron beam is a scanning electron microscope.

17. The apparatus of claim 16, wherein:
    said target tube is electrically isolated from said cryostat with mica.

18. The apparatus of claim 17, wherein:
    said cryostat includes a chamber containing boiling helium.

19. The apparatus of claim 18, wherein:
    said cryostat includes a chamber containing boiling nitrogen.

* * * * *